(12) United States Patent
Reiherzer et al.

(10) Patent No.: US 10,453,825 B2
(45) Date of Patent: Oct. 22, 2019

(54) LIGHT EMITTING DIODE (LED) COMPONENTS AND METHODS

(71) Applicant: Cree, Inc., Durham, NC (US)

(72) Inventors: Jesse Colin Reiherzer, Wake Forest, NC (US); Colin Kelly Blakely, Franklinton, NC (US); Arthur Fong-Yuen Pun, Durham, NC (US); Troy Anthony Trottier, Cary, NC (US)

(73) Assignee: Cree, Inc., Durham, NC (US)

( * ) Notice: Subject to any disclaimer, the term of this patent is extended or adjusted under 35 U.S.C. 154(b) by 48 days.

(21) Appl. No.: 14/538,526

(22) Filed: Nov. 11, 2014

(65) Prior Publication Data

US 2016/0133610 A1    May 12, 2016

(51) Int. Cl.
*H01L 25/075*    (2006.01)
*H01L 33/54*    (2010.01)

(52) U.S. Cl.
CPC .......... *H01L 25/0753* (2013.01); *H01L 33/54* (2013.01); *H01L 2224/48091* (2013.01); *H01L 2224/48137* (2013.01); *H01L 2224/48227* (2013.01); *H01L 2224/8592* (2013.01); *H01L 2924/0002* (2013.01); *H01L 2924/10155* (2013.01); *H01L 2924/181* (2013.01); *H01L 2933/0041* (2013.01)

(58) Field of Classification Search
CPC ..... C04B 35/6261; H01L 33/50; H01L 33/54; H01L 33/56; H01L 33/486; H01L 33/60; H01L 33/504; H01L 33/508; H01L 25/0753

USPC .......................... 257/88–89, 98–99; 313/483
See application file for complete search history.

(56) References Cited

U.S. PATENT DOCUMENTS

| | | |
|---|---|---|
| 7,213,940 B1 | 5/2007 | Van De Ven et al. |
| 7,791,061 B2 | 9/2010 | Edmond et al. |
| 8,058,088 B2 | 11/2011 | Cannon et al. |
| 8,425,071 B2 | 4/2013 | Ruud et al. |
| 8,563,339 B2 | 10/2013 | Tarsa et al. |
| 8,591,062 B2 | 11/2013 | Hussell et al. |
| 8,596,819 B2 | 12/2013 | Negley et al. |
| 8,622,584 B2 | 1/2014 | Kinnune et al. |
| 8,777,449 B2 | 7/2014 | Van De Ven et al. |
| 8,866,169 B2 | 10/2014 | Emerson et al. |
| 8,940,561 B2 | 1/2015 | Donofrio et al. |
| 9,024,349 B2 | 5/2015 | Chitnis et al. |
| 9,028,087 B2 | 5/2015 | Wilcox et al. |
| 9,048,396 B2 | 6/2015 | Lowes et al. |
| 9,070,850 B2 | 6/2015 | Keller et al. |

(Continued)

*Primary Examiner* — Eugene Lee
(74) *Attorney, Agent, or Firm* — Jenkins, Wilson, Taylor & Hunt, P.A.

(57) ABSTRACT

Light emitting diode (LED) components and related methods are disclosed. LED components include a submount, at least one LED chip on a first surface of the submount, and a non-reflective, light permeable structure or dam. The light permeable dam can provide a component having a viewing angle that is greater than 115°. A method of providing an LED component includes providing a non-metallic submount, attaching at least one LED chip to a first surface of the submount, and dispensing a non-reflective, light permeable dam over the first surface of the submount about the at least one LED chip thereby providing a component having a viewing angle that is greater than 115°.

24 Claims, 8 Drawing Sheets

(56) References Cited

U.S. PATENT DOCUMENTS

| | | |
|---|---|---|
| 9,159,888 B2 | 10/2015 | Chitnis et al. |
| 9,182,096 B2 | 11/2015 | Kinnune et al. |
| 9,496,466 B2 | 11/2016 | Hussell et al. |
| 9,618,163 B2 | 4/2017 | Power et al. |
| 2008/0258130 A1 | 10/2008 | Bergmann et al. |
| 2009/0085053 A1* | 4/2009 | Chen ............. H01L 33/50 257/99 |
| 2010/0078664 A1* | 4/2010 | Helbing ........... H01L 33/54 257/98 |
| 2011/0031527 A1* | 2/2011 | Kotani ........... C07D 307/77 257/100 |
| 2011/0181173 A1* | 7/2011 | De Graaf ........ C04B 35/6261 313/483 |
| 2011/0266574 A1* | 11/2011 | Liao ............. H01L 33/508 257/98 |
| 2012/0051041 A1 | 3/2012 | Edmond et al. |
| 2012/0061702 A1* | 3/2012 | Andrews ........... H01L 33/54 257/98 |
| 2012/0097997 A1* | 4/2012 | Chung ............. F21K 9/00 257/89 |
| 2012/0205689 A1* | 8/2012 | Welch ........... H01L 25/0753 257/91 |
| 2012/0327650 A1 | 12/2012 | Lay et al. |
| 2013/0020600 A1* | 1/2013 | Yoo ............. H01L 33/56 257/98 |
| 2013/0105835 A1* | 5/2013 | Wu ............. H01L 25/0753 257/89 |
| 2013/0126927 A1* | 5/2013 | Iguchi ........... H01L 33/60 257/98 |
| 2013/0257266 A1* | 10/2013 | Ishizaki .......... H01L 33/504 313/503 |
| 2014/0203305 A1* | 7/2014 | Kawano .......... H01L 33/486 257/88 |
| 2014/0217433 A1* | 8/2014 | Tudorica ......... H01L 33/56 257/89 |
| 2014/0239325 A1* | 8/2014 | Andrews .......... H01L 33/60 257/98 |
| 2014/0347885 A1 | 11/2014 | Wilcox et al. |
| 2014/0355302 A1 | 12/2014 | Wilcox et al. |
| 2015/0016107 A1* | 1/2015 | Wimmer .......... H01L 25/0753 362/235 |
| 2015/0253488 A1 | 9/2015 | Wilcox et al. |
| 2015/0349218 A1 | 12/2015 | Reiherzer et al. |

* cited by examiner

LIGHT EMITTING DIODE (LED) COMPONENTS AND METHODS

TECHNICAL FIELD

The subject matter disclosed herein relates generally to light emitter components and methods. More particularly, the subject matter disclosed herein relates to light emitting diode (LED) components and related methods.

BACKGROUND

Light emitting diodes (LEDs) or LED chips are solid state devices that convert electrical energy into light. LED chips can be utilized in light emitter components or packages for providing different colors and patterns of light. Light emitter components can be mounted directly onto a surface of an underlying circuit component or heat sink for use in various lighting applications.

One problem with existing LED components is an inadequate viewing angle. Existing LED components, for example, existing surface mount design (SMD) components, have a viewing angle that is about 115°. This is not suitable for use in lighting bulbs or bulb applications, which utilize wider viewing angles for a more uniform light extraction. Manufacturers of LED lighting products are constantly seeking ways to provide components suitable for use in a plurality of different lighting applications, to encourage the adoption of LED products. Components incorporating fewer raw materials at sustained or increased brightness levels with uniform lighting are becoming more desirable.

Accordingly, and despite the availability of various LED components in the marketplace, a need remains for improved components and methods which can be produced quickly, efficiently, at a lower cost, and with larger viewing angles for more uniform lighting in light bulb and/or bulb applications. Such components can be single or multi-chip components, which make it easier for end-users to justify switching to LED products from a return on investment or payback perspective.

SUMMARY

In accordance with this disclosure, novel light emitting diode (LED) components and methods are provided. The components can comprise a submount, at least one LED chip disposed on a first surface of the submount, and a non-reflective, light permeable structure or dam disposed on the first surface of the submount about (around) the at least one LED chip for providing a component having an improved viewing angle, such as for example a viewing angle that is greater than 115°. The non-reflective structure can comprise a silicone dam having one or more fillers or binders. The component can comprise a surface mount design (SMD) type of LED component having, for example, a viewing angle of approximately 120° or more, approximately 130° or more, approximately 140° or more, or more than approximately 160°.

A method of providing LED components can comprise providing a non-metallic submount, attaching at least one LED chip over a first surface of the submount, and dispensing a non-reflective, light permeable structure or dam over the first surface of the submount around the at least one LED chip thereby providing a component having an improved viewing angle, such as for example a viewing angle that is greater than 115°. The reflective structure can comprise a transparent dam for retaining filler material and providing a component having an increased viewing angle, in some embodiments, for use in light bulbs and/or bulb applications.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
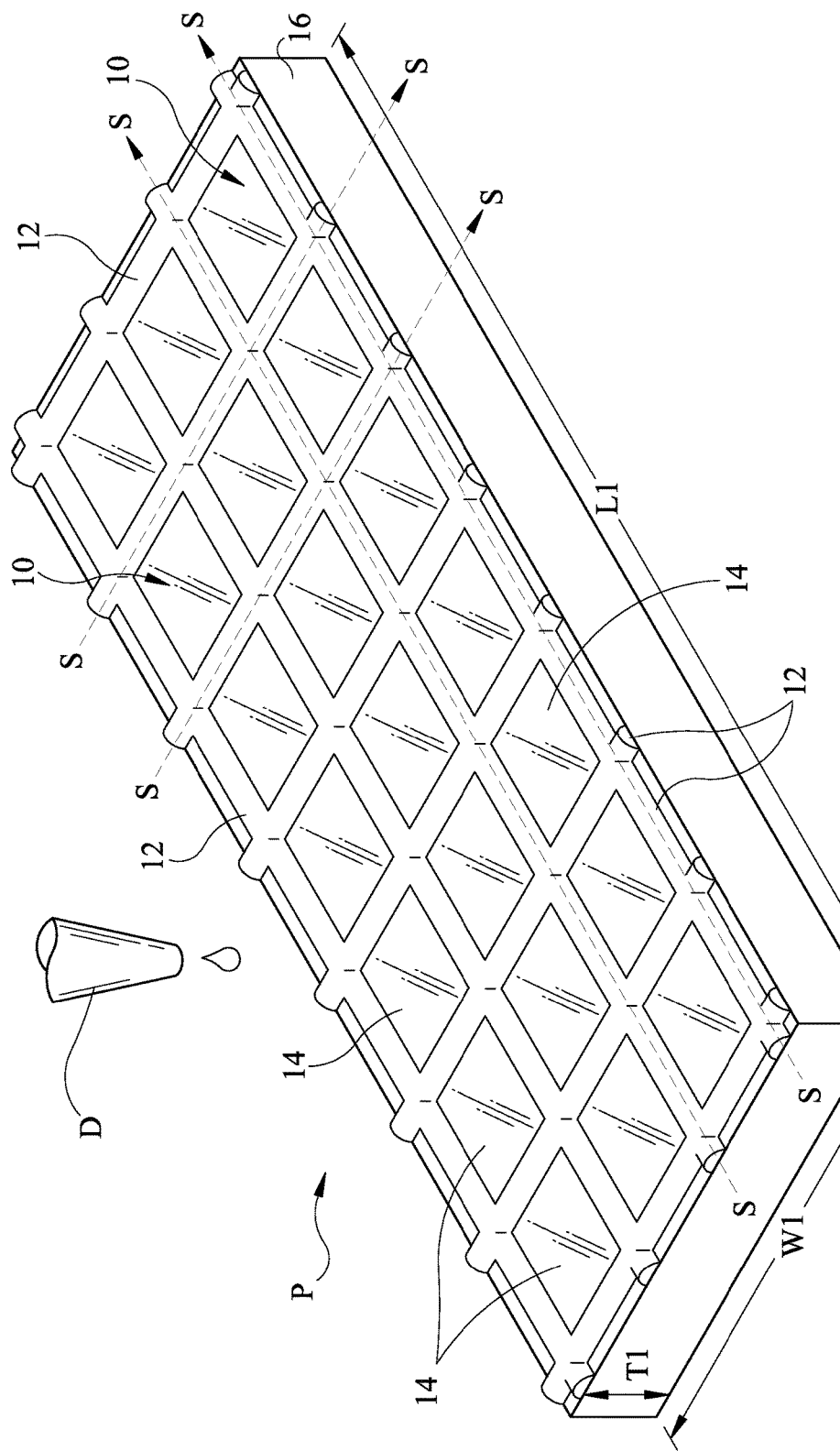
FIGS. 1A and 1B, are perspective views illustrating a panel of light emitting diode (LED) components, or portions thereof, prior to singulation, according to the disclosure herein.

The subject matter disclosed herein is directed to light emitting diode (LED) components and methods.

LED components described herein can be submount based, and singulated from a larger panel of material, for example, a ceramic panel or substrate. This enables a plurality of different and/or customized components to be quickly and efficiently formed over the substrate and obviates the need for extensive processing (e.g., injection molding) and/or tooling. In some embodiments, LED components and methods described herein exhibit improved manufacturability and improved light extraction suitable for use in a wide variety of lighting applications, including and not limited to light bulbs.

In some embodiments, components herein comprise electrical contacts or traces that can comprise a minimized surface area over portions of the submount to reduce interference with light as described in commonly owned, assigned, and co-pending U.S. patent application Ser. No. 14/292,331, the content of which is incorporated by reference herein, in the entirety. The metallic can be spaced apart from one or more LED chips and disposed proximate the outermost edges of each individual submount for reducing interference with, absorption of, and/or potential blockage of light. Each trace can be disposed over a panel and below a wall, "dam", or other structure.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene.

References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", "including", and "having" as used herein should be interpreted as open-ended terms that do not preclude the presence of one or more elements.

As used herein, the terms "through-hole", "thru-hole", and/or "via" are synonymous and refer an opening in the submount, often filled and/or lined (e.g., along one or more side walls) with an electrically conductive material that allows for an electrically conductive conduit or pathway between different layers, surfaces, or features of the component.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

As used herein, the term "viewing angle" represents the luminous intensity of the LED component in space, which is characterized by an optical far field pattern (FFP). The viewing angle characterized by a FFP comprises a normalized luminous intensity ratio at different radiation angles. As used herein, the viewing angle is the angular extent to which the intensity of light emitted from the LED component is at least about 50% of the intensity peak in a FFP.

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, North Carolina. Other growth substrates are also contemplated herein, for example and not limited to sapphire, silicon (Si), and GaN.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip).

Where used, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal (e.g., anode or cathode) solder bonded to a carrier substrate, mounting pad, or PCB and a second terminal (e.g., the opposing anode or cathode) wire bonded to the carrier substrate, electrical element, or PCB.

Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit light at a different wavelength such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the green, yellow, and/or red wavelength spectrum. The components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. Patent Application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety.

In some embodiments, panels, substrates, and/or submounts described herein comprise ceramic, and have a thermal conductivity of greater than approximately 5 W/mK, greater than approximately 10 W/mK, greater than approximately 50 W/mK, greater than approximately 100 W/mK, greater than approximately 150 W/mK, or greater than approximately 200 W/mK. In more particular embodiments, the thermal conductivity of panel substrates described herein can be approximately 20 W/mK (+ or −5 W/mK), such as for when the submount comprises alumina, or the thermal conductivity of the submount can be approximately 170 W/mK (+ or −5 W/mK), such as for when the submount comprises AlN.

It is understood that light emitter components and methods according to the present subject matter can also have multiple LED chips of different colors, one or more of which can be white emitting.

FIGS. 1A through 4 illustrate embodiments of LED components and related methods according to the present subject matter as disclosed and described herein. In some embodiments, LED components herein comprise submount based SMD components, adapted for connection to portions of a circuit, circuitry, heat sink, and/or other electrically or thermally conductive surfaces.

Figure 1B:
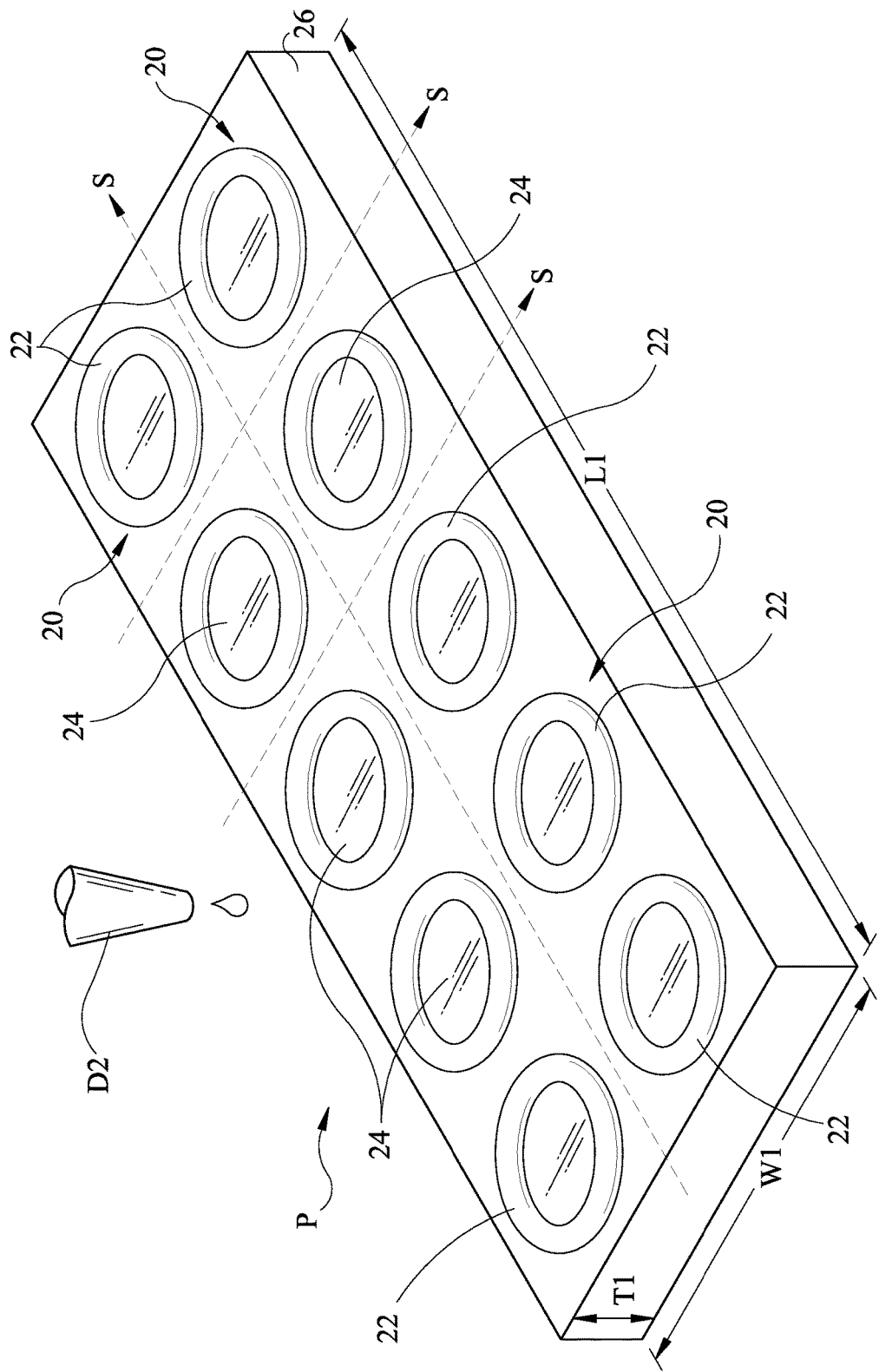

Referring in general to FIGS. 1A and 1B, a plurality of LED components can be provided and/or formed over a substrate or panel, generally designated P. One or more individual LED components 10 (FIG. 1A) and 20 (FIG. 1B) can be formed over and then singulated, separated, and/or otherwise physically isolated from panel P. In some embodiments, a plurality of submount based SMD components 10 and 20 can be formed over panel P.

In some embodiments, panel P, and portions thereof, form the building blocks for the novel LED components provided herein, as customized LED components can easily be formed or provided over panel P. For example and as FIG. 1A illustrates, components 10 can comprise substantially square shaped retention structures or dams 12. In other embodiments and as FIG. 1B illustrates, components 20 can also comprise substantially circular retention structures or dams 22. Any size and/or shape of components (e.g., 10, 20) and respective retention dams (12, 22) can be provided. Notably, multiple LED components can be formed and/or batch processed over panel P and later separated therefrom.

One or more individual components 10 and/or 20, or products incorporating components 10 and/or 20, can then be sorted and shipped to customers or consumers based upon electrical and/or optical properties.

In some embodiments, panel P comprises a substrate comprising any suitable length, such as for example and without limitation a length L1 of approximately 4 inches (") and any suitable width, such as for example a width W1 of approximately 2" (e.g., 4"×2") such that approximately 120 LED components having individual submounts (e.g., 16', FIG. 2A) of approximately 5 mm×5 mm can be formed thereon and/or singulated therefrom. In other embodiments, panel P is approximately 5 inches (") in length L1 and/or width W1, approximately 4" in length L1 and/or width W1, approximately 3" in length L1 and/or width W1, or approximately 2" in length L1 and/or width W1. However, any size and/or shape of panel P can be provided.

Figure 2A:
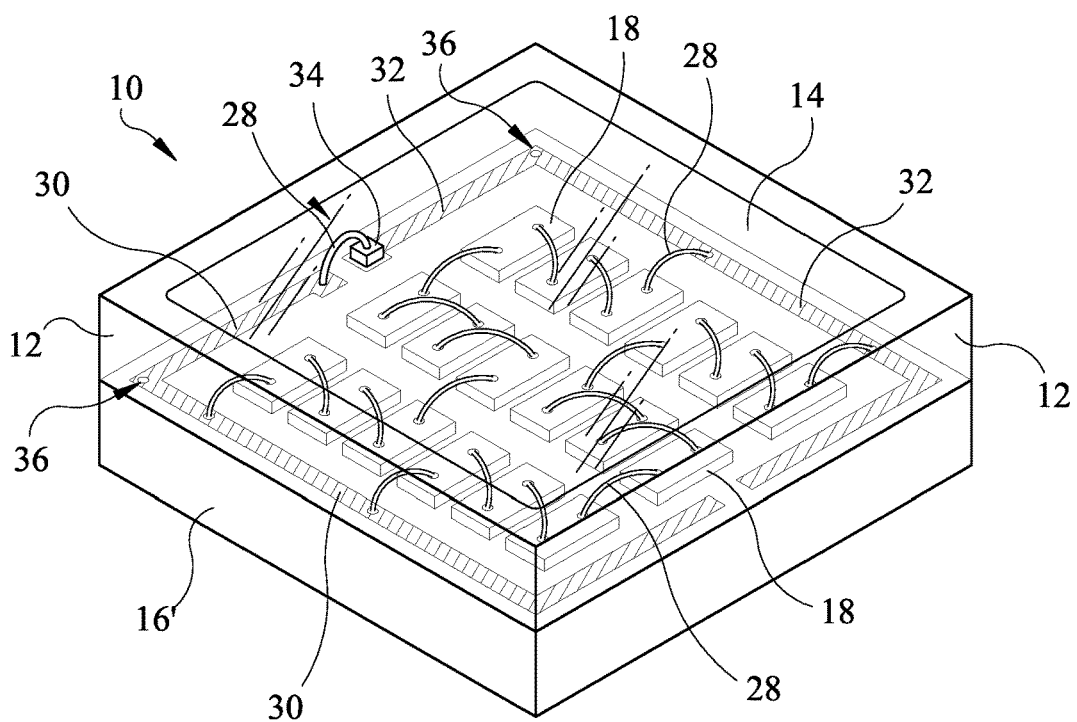
FIGS. 2A and 2B are perspective top views illustrating singulated LED components according to the disclosure herein.

In some embodiments, panel P can be singulated (e.g., cut, sawn, diced, broken, laser cut, etched, etc.) along singulation lines S into individual components 10, 20 having individual submounts (e.g., 16', FIG. 2A). Any size and/or number of LED components 10, 20 can be formed upon and singulated from panel P. Each component (e.g., 10 and/or 20) can comprise an individual submount (e.g., 16', FIG. 2A) that is larger or smaller than 5 mm per side (e.g., 20 mm per side, 10 mm per side, 8 mm per side, 7 mm per side, 4 mm per side, 3 mm per side, or less than 3 mm per side, etc.). Non-rectangular and non-square panels P and components, respectively, can also be provided. Any combination of submount size/shape (e.g., 16', FIG. 2A) and retention structure size/shape (e.g., 12, 22) can be provided.

Still referring in general to FIGS. 1A and 1B and in some embodiments, panel P can comprise any suitable height or thickness, such as for example any thickness T1 between approximately 0.1 mm and 5.0 mm. For example, in some embodiments, panel P comprises a thickness T1 of approximately 2 mm or less, approximately 1 mm or less, approximately 0.8 mm or less, or approximately 0.5 mm or less. In some embodiments, panel P is approximately 0.635 mm thick. In other embodiments, panel P is approximately 0.35 mm thick or more. As noted above, any size and/or shape of panel P can be provided.

Panel P can comprise any metallic or non-metallic material. In some embodiments, panel P comprises a highly reflective material, such as a white, silver, or transparent ceramic based material configured to improve light extraction and reflectance. Panel P can comprise a highly reflective aluminum oxide (e.g., alumina or $Al_2O_3$) or aluminum nitride (AlN) panel with reflective particles dispersed or doped therein. Panel P can also comprise any suitable oxide ceramic such as zirconium oxide, or zirconia ($ZrO_2$), or a mixture, composite or alloy of zirconia and/or alumina. Panel P can comprise a powder based (e.g., "green") ceramic that is pressed and fired prior to attachment of one or more LED chips (18, FIG. 2A). Panel P can comprise at least one substantially flat or planar surface over which the one or more LED chips (18, FIG. 2A) can be supported, mounted, and/or attached.

Notably, LED components (e.g., 10 and 20) provided herein can be efficiently batch formed and/or batch processed over panel P, to thereby simultaneously form a plurality of customized packages that are submount based and provided at lowered costs and/or have improved manufacturability. Notably, components 10 and 20 formed over panel P can comprise a clear or transparent retention structure 12 and 22, respectively, for increasing a viewing angle associated with the components. In some embodiments, components 10 and 20 include a wider viewing angle that is greater than 115°, which renders the components suitable and/or operable for light bulb or bulb type applications (see e.g., FIG. 4).

That is, customized components (e.g., 10, 20), which are customized with regards to size, shape, color, number, and/or connectivity of LED chips, traces (e.g., customized size, shape, and/or placement thereof), retention structures (e.g., customized size, shape, material, color, placement thereof), and/or optical elements (e.g., customized shape, size, placement, dome height, etc.) can be provided over as a batch over panel P, and batch processed. Aspects of the LED chips, traces, retention structures and/or optical elements can be customized to provide light emitter components operable at various electrical and/or optical specifications per customer and/or consumer requests. Components 10 and/or 20 can be customized in regards to a beam shape, a beam size, a beam direction, and/or a color temperature, for example, by customizing at least the size, shape, and/or thickness of retention structure 12 (FIG. 1A) and/or 22 (FIG. 1B).

As described in commonly owned and co-pending U.S. patent application Ser. No. 14/292,331, the content of which was incorporated herein by reference in the entirety above, panel P can be highly reflective to visible light (e.g., greater than about 90%) and provide conduction of heat as well as mechanical support. In some embodiments, non-metallic and/or ceramic materials containing $Al_2O_3$ exhibit such qualities. Accordingly, panel P (i.e., and individual submounts (16', FIG. 2A) singulated therefrom can comprise a ceramic based body of material comprising $Al_2O_3$. Panel P can also comprise any of a variety of optional light scattering particles contained therein. Examples of suitable scattering particles can for example comprise particles of $Al_2O_3$, $TiO_2$, $BaSO_4$, $ZrO_2$, and/or AlN.

In some embodiments, panel P is similar to and/or provided using methods described in U.S. utility patent application Ser. No. 11/982,275, filed Oct. 31, 2007 and/or U.S. utility patent application Ser. No. 12/757,891, filed Apr. 9, 2010. The entire contents of each of these references are hereby incorporated by reference herein.

In some embodiments, each retention structure 12, 22 or retention dam/wall can be dispensed over panel P after providing traces (e.g., 30, 32, FIG. 2A), other components (e.g., chip 34, FIG. 2A), and after die attaching and optionally wire bonding LED chips (e.g., 18, FIG. 2A). Structures 12 and 22 can be dispensed over the traces (e.g., 30, 32) or other components via a dispensing tool D, to cover such components.

As FIG. 1A illustrates, structure 12 is configured to retain a filler material 14. Structure 12 and filler material 14 are disposed over a substrate portion 16 of panel P. Similarly and as illustrated in FIG. 1B, retention structure 22 is configured to retain a filler material 24. Structure 22 and filler material 24 are disposed over a substrate portion 26 of panel P. Filler material can comprise any suitable material not limited to a silicone encapsulant, with or without optical conversion material (e.g., phosphor(s), lumiphor(s), etc.).

In some embodiments, retention structures 12 and 22 comprise silicone (e.g., a liquid curable silicone) having a binder, filler, binding material, or filler material dispersed or doped therein. A plurality of retention walls or structures 12 and 22 can be dispensed over panel P and over a portion of electrical components (see, e.g., sectional views FIGS. 2A-2K), not limited to traces, wire bonds, or connectors, and/or electrostatic protection devices (ESD). Retention structures 12 and 22 can comprise a non-reflective and light transmissive material, which can visually appear at least substantially or completely transparent or clear in appearance. Notably, light can pass through structures 12 and 22, which increases the viewing angles associated with components 10 and 20, respectively. Retention structures 12 and 22 are not opaque, and are devoid of opaque fillers, particles, or microstructures. Retention structures 12 and 22 can comprise wavelength conversion material or particles (e.g., phosphor), which is light transmissive and merely changes a wavelength or color of the light upon impingement with light from one or more LED chips (e.g., 18, FIG. 2A).

Referring to FIG. 1A and in some embodiments, a plurality of retention structures 12 can intersect and form a network of dams or walls over panel P, between which filler material 14 can be provided. Retention structures 12 can intersect for forming walls or dams between adjacent devices or components 10 to be singulated from panel P. In some embodiments and upon singulation, panel P and retention structures 12 are cut, sawn, diced, laser cut, etched, or otherwise separated along singulation lines S, which are shown in broken lines for illustration purposes, such that structures 12 form external surfaces or lateral walls of individual light emitter components 10. In some embodiments, retention structures 12 can, but do not have to, comprise a same size and/or shape as the individual portions (e.g., 16', FIG. 2A) of underlying panel submount 16.

Referring to FIG. 1B and in some embodiments, a plurality of non-overlapping and/or non-intersecting retention structures 22 can be provided (e.g., dispensed) over panel P. Filler material 24 can be provided between and/or within inner surfaces of separate and discrete retention structures 22. Retention structures 22 can be any size and/or shape (e.g., circular, non-circular, symmetric, asymmetric, etc.). In some embodiments, upon singulation along singulation lines S, circular retention structures 22 can be provided over non-circular submounts. Retention structures 22 can comprise a same size and/or shape as individual portions (e.g., 16', FIG. 2A) of the underlying panel substrate 26, or different (e.g., smaller) sizes and/or shapes than the underlying panel substrate 26.

In some embodiments, retention structures 12 and/or 22 comprise a polymeric and/or plastic material. In some embodiments, retention structures 12 and/or 22 are devoid of any color or pigment. Retention structures 12 and/or 22 can comprise a matrix of transparent (e.g., transmissive to light) or clear silicone or epoxy with one or more binders dispersed therein. Retention structures 12 and/or 22 can, but do not have to, contain and/or be coated with an amount of wavelength conversation material (e.g., phosphor(s)) while remaining devoid of reflective particles and/or reflective properties. That is, retention structures 12 and/or 22 can be non-reflective, and instead allow light to readily pass therethrough. Retention structures 12 and 22 can be at least partially, if not fully, transparent for readily emitting light therefrom and/or allowing light to pass there through. This can advantageously result in a larger viewing angle, and increase demand and use of such LED components. Transparent structures 12 and 22 also enable components 10 and 20, respectively, to accommodate a larger number of lighting applications (e.g., energy efficient bulbs, FIG. 4).

Retention dam or structures 12 and/or 22 can be provided in various thicknesses or heights vertically disposed with respect to panel P. In some embodiments, retention structures 12 and/or 22 comprise a single layer of material. In other embodiments, retention structures 12 and 22 comprise multiple layers of material, and can be dispensed in more than one layer (e.g., FIGS. 2F-2K) via dispensing tool D.

Retention structures 12 and/or 22 can be substantially uniform in height, or vary in height across panel P.

In some embodiments, retention structures 12 and 22 can comprise, without limitation, a transparent or clear silicone having light-permeable binders or fillers therein, including but not limited to fumed silica, silica gel, nanomaterials (e.g., nano-binders or nano-fillers), ceramic nanoparticles, ceramic micro-particles, quantum dots, phosphor, ceramic fiber(s), non-ceramic fiber(s), combinations thereof, or any other suitable filler(s) and/or binder(s).

The broken lines in FIGS. 1A and 1B illustrate separation or singulation lines S, along which adjacent light components 10 and 20, respectively, and respective submounts (e.g., 16', FIG. 2A), are singulated or separated from each other. Individual components 10 and/or 20 can be separated from each other via sawing, breaking, dicing, shearing, scribing, machining, cutting, grinding, laser cutting, etching, combinations thereof, and/or any other suitable process. As FIG. 1A illustrates, singulation lines S can extend through portions of retention structures 12, such that upon singulation, retention structures 12 are cut into, for forming interior and/or exterior walls (e.g., lateral edges) of the one or more individual light emitter components 10. As FIG. 1B illustrates, singulation lines S may not extend through retention structures 22, but rather each structure may remain discrete. Retention structures 12 and 22 can be dispensed in any location, size, shape, and/or orientation over panel P.

As used herein, the term batch processes or batch processing refers to one or more processing steps, not limited to depositing traces (e.g., electroplating, deposition, electroless plating, etc.), die attaching LED chips, wire bonding LED and/or ESD chips, dispensing retention structures 12 and 22, forming electrically conductive vias (e.g., 36, FIG. 2A), dispensing encapsulant (e.g., filler material 14 and 24), molding optional optical elements, curing, and/or individual component singulation.

Figure 2B:
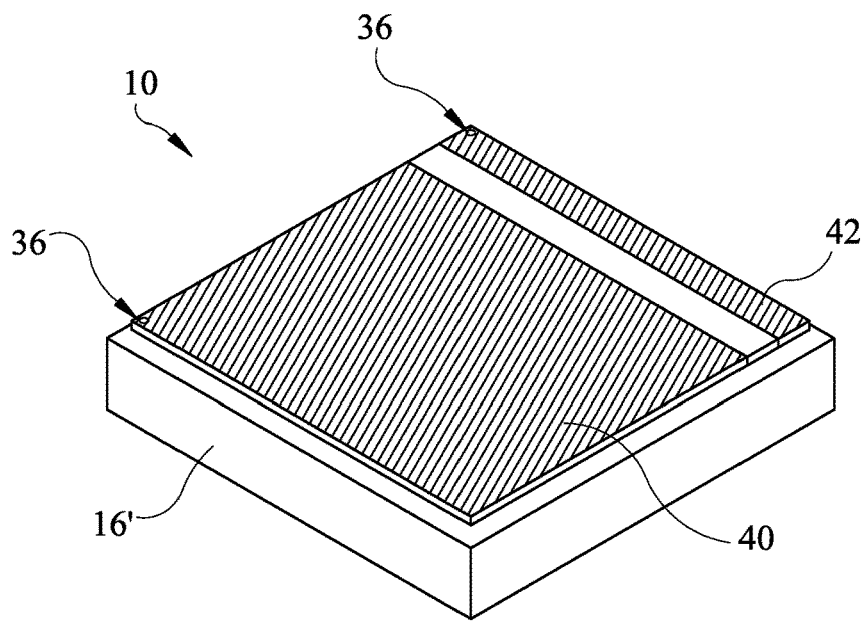

FIGS. 2A and 2B illustrate an individual, singulated LED component 10. FIGS. 2C to 2K illustrate various sectional views which may be associated with LED component 10; however, for illustration purposes FIGS. 2C to 2G illustrate one or two LED chips 18. Component 10 can be separated from panel P (FIG. 1A) and other, adjacent components after processing the plurality of components, or portions thereof, as a group or batch, thereby improving manufacturability of each component 10.

Referring to FIG. 2A, LED component 10 comprises a submount 16', which is singulated from a portion of panel P and substrate 16. Submount 16' can comprise a highly reflective and non-metallic ceramic material as described above. At least one LED chip 18 can be die attached to submount 16', and in some aspects a plurality of LED chips 18 are die attached to submount 16'. LED chips 18 can be die attached directly or indirectly to submount 16' using any suitable material, such as silicone, epoxy, solder, adhesive, tape, etc.

LED chips 18 can be wire bonded to each other and/or one or more electrically conductive portions of material (e.g., component contacts of terminals) via wire bonds 28. Wire bonds 28 can comprise any electrically conductive material such as a metal, a metal alloy, Au, Al, Sn, Ag, Cu, etc. LED chips 18 can be vertically structured and devoid of wire bonds 28, however, and for illustrate purposes, horizontally structured and wire bonded LED chips are illustrated. LED chips 18 can be serially connected, connected in parallel, and/or combinations thereof between anode/cathode contacts or terminals (e.g., traces 30 and 32).

Multiple LED chips 18, where provided, can be configured to emit a same color of light, or different colors of light. LED chips 18 can be configured to emit light that is primarily blue, blue shifted yellow (BSY), cyan, green, red, yellow, red-orange, orange, amber, and/or white. Any color of LED chip 18 can be provided. LED chips 18 can be configured to activate a yellow, red, and/or green phosphor disposed directly over LED chip 18 and/or over or within a portion of walls or structures 12 and/or filler material 14 for producing cool and/or warm white output.

In further embodiments, one or more primarily red LED chips 18 can be included in emitter component 10 and can be used alone and/or combination with one or more BSY chips 18. In some embodiments, a red LED chip can also optionally be disposed below a phosphor, encapsulant, filling, or filler material 14 with a phosphor layer and/or uniformly dispersed phosphors for mixing to produce warm white output. LED chips 18 can comprise any size and/or shape. LED chips 18 can be substantially square, rectangular, regular, irregular, or asymmetrical in shape. In some embodiments, LED chips 18 can, for example, comprise a footprint where at least one side (e.g., a length or width) measures approximately 2000 µm or less, such as approximately 1000 µm or less, approximately 900 µm or less, approximately 700 µm or less, approximately 600 µm or less, approximately 500 µm or less, approximately 400 µm or less, approximately 300 µm or less, approximately 200 µm or less, approximately 100 µm or less, and/or combinations thereof where multiple LED chips 18 are used. Any dimension of LED chip(s) 18 can be provided.

A plurality of electrical contacts, such as electrically conductive traces 30 and 32, can be provided over panel P (FIG. 1A) and each submount 16' that is singulated therefrom. In some embodiments, the plurality of traces 30 and 32 comprises a pair of electrical contacts (e.g., an anode/cathode pair) for supplying current to LED chips 18 disposed there between and/or electrically connected thereto. Traces 30 and 32 can comprise areas of electrically conductive material, such as metal or a metal alloy, which can be plated or otherwise deposited (e.g., physically, chemically, CVD, PECVD, etc.) over submount 16'. In some embodiments, traces 30 and 32 are disposed over a top side or surface of submount 16' via sputtering, electroplating, electroless plating, depositing (e.g., chemical, plasma, vapor, and/or physical deposition), lithography processing, photoresist processing, stenciling, and/or any other suitable process or technique. Traces 30 and 32 can be thin and optionally comprise one or more layers of material. Traces 30 and 32 can be, but do not have to be, disposed proximate outermost areas of submounts 16' formed from panel P, and optionally covered with retention structure 12. The size, shape, number, location, thickness, and/or material of traces 30 and 32 can be customized for use in various lighting applications.

Still referring to FIG. 2A, component 10 can further comprise at least one ESD protection device 34 electrically connected to traces 30 and 32 via one or more wire bonds 28. ESD protection device 34 can comprise a vertically structured device (e.g., opposing bond pads) that is reversed biased or electrically connected in reverse polarity to LED chips 18. ESD protection device 34 can, for example, comprise a vertical silicon (Si) Zener diode, a dual back-to-back Zener diode, a different LED chip arranged in parallel and reverse biased to light emitting LED chips 18, a surface mount varistor, and/or a lateral Si diode. Horizontally structured ESD protection devices 34 (e.g., adjacent bond pads) can also be provided.

ESD protection device 34 can be mounted over submount 16' using any known material and/or technique. ESD protection device 34 can be smaller than LED chips 18 so that it does not occupy an excessive area of submount 16'. ESD protection device 34 can also be covered by retention structure 12 (e.g., proximate an edge of component 10) so that it does not block and/or absorb a significant amount of light. ESD protection device 34 can prevent excessive current from passing through component 10 during an ESD event by providing an alternative path for current to flow besides the LED chips 18. Wire bond 28 extending from ESD protection device 34 and/or LED chips 18 can terminate under, below, and/or within portions of the dam or retention structure 12. In some embodiments, component 10 comprises an SMD in which electrical traces 30 and 32, wire bonds 28, and/or ESD protection device 34 are covered (e.g., fully or at least partially) by and/or within retention structure 12. Component 10 can be devoid of uncovered traces 10 on a top surface thereof.

Electrically conductive vias, generally designated 36, can optionally be provided within portions of panel P (FIG. 1A) and each submount 16' that is singulated therefrom. Vias 36 can comprise a plurality of openings, apertures, and/or holes extending internally within panel P and each submount 16' that is singulated therefrom. Vias 36 can be, but do not have to be, vertically aligned or parallel with respect to the vertical axis of a submount thickness (e.g., which corresponds to panel thickness T1, FIG. 1A). Vias 36 can be filled and/or plated with electrically conductive material, such that top contacts or traces 30 and 32 can electrically communicate with bottom contacts or traces (e.g., 40 and 42, FIG. 2B). Bottom traces (e.g., 40 and 42) can be disposed or attached on a back side of panel P and respective submounts 16', which oppose the surface upon which LED chips 18 are provided. A plurality of bottom traces (e.g., 40 and 42) can be provided on or over panel P prior to singulation of individual components 10.

Referring now to FIG. 2B and in some embodiments, component 10 comprises first and second electrical contacts 40 and 42 disposed on a bottom surface of submount 16'. First and second contacts 40 and 42 can be physically (e.g., and also electrically) separated from each other. Contacts 40 and 42 can comprise SMD pads or contacts configured to electrically communicate directly with an external circuit, and optionally thermally communicate with an external heat sink. In some embodiments, the circuit is also the heat sink. In other embodiments, the heat sink and circuit can comprise separate components.

First and second contacts 40 and 42 can electrically communicate to or with traces 30 and 32, respectively, using the one or more internally disposed thru-holes or vias 36. Vias 36 can extend internally within a portion of submount 16' depending upon how formed within panel (e.g., P, FIG. 1A) and how panel is subdivided into individual submounts 16'. Vias 36 can comprise conduits for transferring electrical current between first and second bottom contacts 40 and 42 and respective traces 30 and 32. Vias 36 also comprise conduits for passing electrical current to and from LED chips 18 within component 10.

Referring now to FIGS. 2A to 2K in general, at least one LED chip 18 is provided between each pair of traces 30 and 32. In some embodiments, multiple LED chips 18 are provided between each pair of traces 30 and 32. Any desired connectivity of LED chips 18, including combinations of serially and parallel connected chips, can be provided within component 10. LED chips 18 can be visible through structures 12 from outside component 10, as structures are non-opaque, clear, and/or transparent. The size, shape, structure, color, number, and/or connectively of LED chips 18 provided between traces 30 and 32 can be customized for use in various lighting applications. Various combinations of LED chips 18 and phosphors can also be provided, for providing a desired color and light output from emitter component 10.

Retention structure 12 can comprise a clear or light transmissive wall or dam having any suitable thickness and/or height. In some embodiments, the thickness of each wall can be any value between approximately 0.1 and 2.0 mm, however, any thickness can be provided. Retention structure 12 can comprise a height having any value between approximately 0.1 mm and 3.0 mm. The height and the thickness of the dam can be independent of each other. The height of the dam can in some aspects be directly correlated with the height of the LED chips in the package (for a flat package), as the height of the dam should be above the height of the LED chips so that the LED chips can be covered entirely with encapsulant.

In one aspect, the dam height range can be from approximately 0.2 mm to 5.0 mm and the dam thickness can be from approximately 0.1 mm to 5.0 mm.

Still referring in general to FIGS. 2A to 2K, filler material 14 can be provided over submount 16' and retained via internal walls of structure 12. In some embodiments, filler material 14 is dispensed between portions of at least two opposing walls 12 via a dispensing tool or dispenser D (e.g., FIGS. 1A and 1B). In other embodiments, filler material 14 can be molded and cured. Filler material 14 can comprise an optical element for producing a certain shape, color, and/or beam pattern of light, in combination with structures 12. Filler material 14 can comprise a planar surface, a curved surface, a domed surface, or combinations thereof as illustrated by the broken lines in FIG. 2C. In some embodiments, filler material 14 comprises an encapsulant, where at least a portion of the encapsulant is disposed on a same side or surface of submount 16' to which LED chips 18 are mounted to, and/or a same side or surface to which traces 30 and 32 are deposited. In some embodiments, filler material 14 is formed directly and/or indirectly over a top surface of submount 16' and disposed directly over the at least one LED chip 18 supported thereby. An array of lenses, domes, or optical elements comprising filler material 14 can be dispensed and/or positioned over panel P (FIG. 1A) from which individual components 10 are singulated.

In some embodiments, filler material 14 comprises a silicone matrix, encapsulant, or plastic material, which can be deposited or dispensed directly over panel P and respective submounts 16' without incurring time or expense associated with overmolded lenses. Filler material 14 can be dispensed to any height between walls or structures 12 and optionally cured prior to singulation of individual components 10 from panel P (FIG. 1A). In some embodiments, filler material 14 may come over and often cover the top and/or sides of walls 12, or portions thereof.

Filler material 14 can provide both environmental and mechanical protection of individual light emitter components 10. In some embodiments, an optional layer of optical conversion material(s), such as phosphor(s), can be applied directly on or over the one or more LED chips 18, on, over, or within one or more surfaces of filler material 14 (e.g., an inner, outer, upper, or lower surface), and/or on, over, or within retention structures 12 for producing cool and/or warm white output. Optical conversion material (i.e., wavelength conversion material including phosphor) can be uniformly or non-uniformly dispersed within filler material 14.

Optical conversion material can comprise one or more phosphors adapted to emit blue, yellow, red, and/or green light upon impingement with light from the one or more LED chips 18. In some embodiments, optical conversion material is provided when filler material 14 is in liquid form and fixed therein as filler material 14 cures.

Notably, components 10 can be devoid of a costly leadframe encased within molded plastic, an can rather utilize thin, electrically conductive traces 30 and 32, which can be customized with respect to size, placement, layout, and/or electrical configuration with respect to LED chips 18 and bottom contacts 40 and 42. Individual light emitter components 10 can each comprise an individual submount 16' over which LED chips 18 are provided, where each submount 16' is a portion of panel P, which is singulated from panel P during a singulation process (e.g., sawing, dicing, laser cutting, shearing, breaking, etc.). Submount 16' can comprise any size, shape, and/or cross-sectional shapes. For illustration purposes, a substantially square shape having a substantially rectangular cross-sectional shape is illustrated, however, any other non-square and non-rectangular shape(s) can be provided.

In some embodiments, submount 16' can comprise a length and width of approximately 5 mm×5 mm, or a surface area of approximately 25 mm². As noted above however, any size and/or shape of submount 16' can be provided (e.g., where a length and/or width is approximately 10 mm or less, approximately 7 mm or less, approximately 5 mm or less, approximately 3 mm or less, etc.). Submount 16' can comprise any thickness, such as between approximately 0.35 and 2.0 mm thick. In some embodiments, submount 16' is approximately 0.6 mm, or 0.635 mm. Submount 16' can also be thicker than 0.5 mm or 1.0 mm (e.g., 2.0 mm, 3.0 mm, etc.) where desired.

Figure 2C:
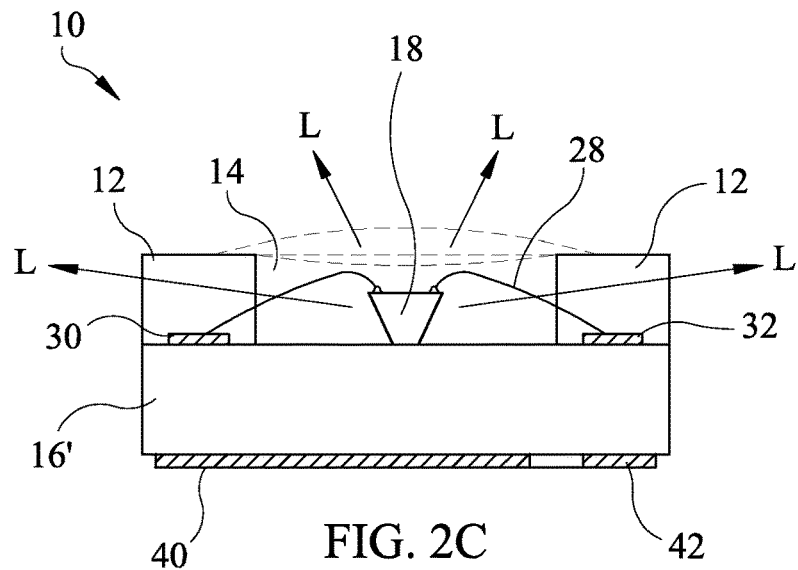
FIGS. 2C to 2K are sectional views illustrating LED components according to the disclosure herein.
Figure 2D:
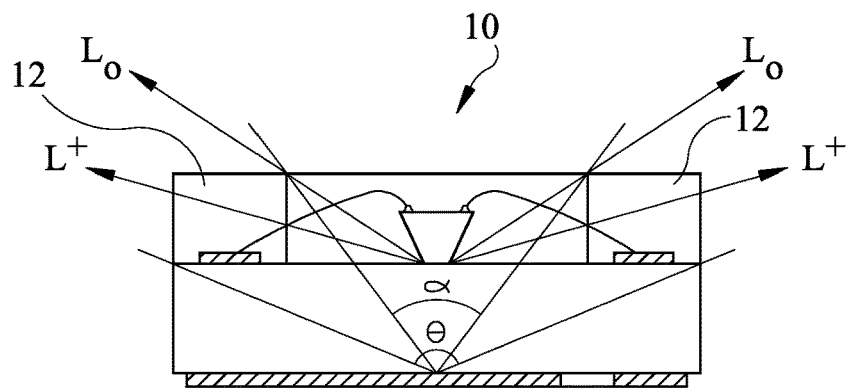

Referring now to FIGS. 2C and 2D, light transmission through structures 12 and its effect on viewing angle is illustrated. As FIG. 2C illustrates, light L passes through retention structure 12. Structure 12 can be clear, transparent, or otherwise permeable to light. That is, structure 12 is not reflective. This advantageously increases a viewing angle of component 10, allowing it to be used within more lighting products, fixtures, and/or provide lighting designers and bulb manufacturers with more options. A single LED chip 18 or multiple LED chips 18 can be provided per component 10.

As FIG. 2D illustrates, when light $L^+$ (FIG. 2C) is allowed to pass through retention structures 12, a viewing angle increases from a first angle a (e.g., indicative of having a reflective dam, wall, or structure in which light $L_0$ is emitted which does not pass through the dam) to a second, larger angle θ, indicative of having a non-reflective dam, wall or structure 12. Larger viewing angles θ are suitable for light bulb applications, as bulbs typically emit multi- or omnidirectional light, both above and below a horizontal plane, or on either side of a vertical plane, where the component is vertically disposed within a bulb or fixture (e.g., FIG. 4).

In some embodiments, viewing angle θ is greater than 115°. Viewing angle θ can be approximately 116° or more, approximately 118° or more, approximately 120° or more, approximately 125° or more, approximately 130° or more, approximately 140° or more, approximately 150° or more, approximately 160° or more, or up to 180°. Viewing angle θ can for example be any value between approximately 116° and 180°. Increasing the viewing angle here does not adversely affect color temperature, or other optical properties associated with component 10.

As FIGS. 2C and 2D further illustrate and in some embodiments, component 10 can comprise a retention structure 12 having a substantially square shaped cross-section. Individual components 10 are built and batch processed over a ceramic panel (e.g., P, FIG. 1A) prior to singulation therefrom. During singulation, the dams or structures 12 that are dispensed between adjacent components 10 can be cut into (e.g., cut in half), such that one dispensed dam becomes split between at least two adjacent components 10. Retention structures 12, therefore, can form external walls of individual components 10. Retention structures 12 can comprise substantially planar inner walls which retain filler material 14, such as to confine phosphor for example that is disposed over the submount, substantially planar outer walls, or both planar inner and outer walls, which can also be substantially parallel. During singulation, smooth retention structures 12 can be formed. The cross-sectional shape of retention structures 12 can be customized for producing resultant customized beam patterns and/or beam shapes.

Figure 2E:
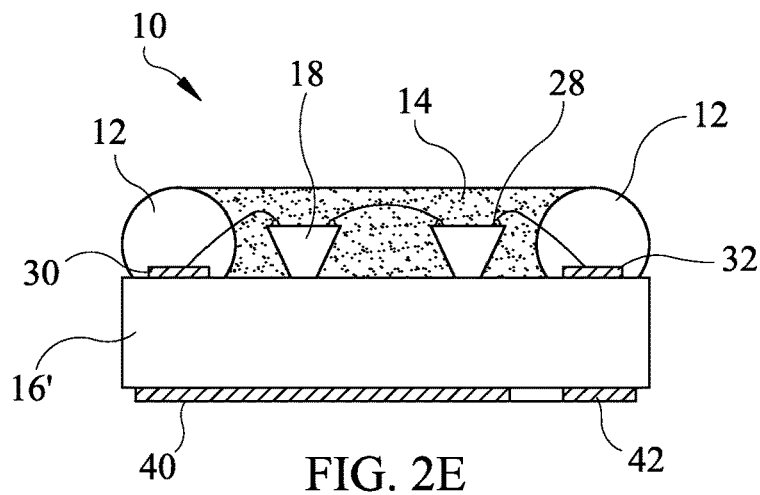

FIG. 2E illustrates component 10 having substantially rounded or curved cross-sectional retention structures 12. Tools used to dice, break, saw, or otherwise separate retention structures 12 can customize the shape of structures 12, where desired. In some embodiments, filler material 14 can comprise one or more particles of optical conversion material dispersed or doped therein. Such materials are designated by the speckled appearance of 14 in FIG. 2E, and can comprise phosphors or lumiphors which can be uniformly or non-uniformly dispersed and set within filler material 14. As the sectional views illustrate, wire bonds 28 and traces 30, 32 can also be disposed within a portion of retention structure 12.

FIGS. 2F to 2K illustrate various embodiments of component 10, in which retention dams or structures 12 are applied in multiple layers, where each successive layer is indicated by 12', 12", etc. Retention structures 12 comprise at least one layer of material, but may comprise two or more (e.g., three, four, five, etc.) discrete layers of material. Third layer 12" is illustrated in broken lines, as it is optional, and may or may not be provided. For illustration purposes, only three layers are illustrated, however, more than three layers can also be provided. Each layer can comprise silicone with one or more binders or fillers, such that the resulting structure 12 (i.e., and any additional layer 12', 12", etc.) is clear or transparent. Retention structure 12 (i.e., and any additional layers 12', 12", etc.) can also include lighttransmissive, wavelength-shifting phosphor(s) dispersed therein.

Figure 2F:
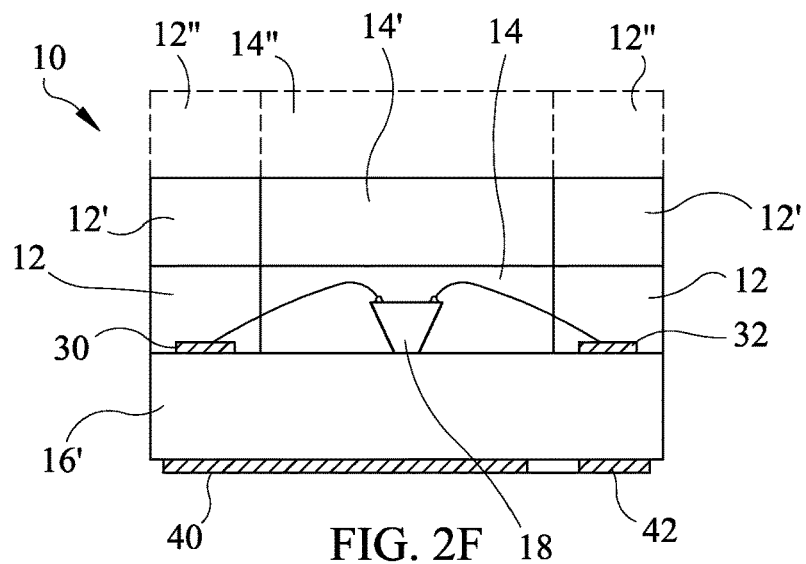

FIG. 2F illustrates retention structures 12 having multiple layers 12' in addition to filler material 14 having multiple layers designated as 14', 14", etc. Each additional layer 14', 14", etc., of filler material 14 can contain phosphor or be devoid of phosphor. Where phosphor is provided, it may be uniformly or non-uniformly dispersed therein. Similarly, layers 12' of retention structures 12 may be devoid of phosphor, or contain phosphor uniformly or non-uniformly dispersed therein.

Figure 2G:
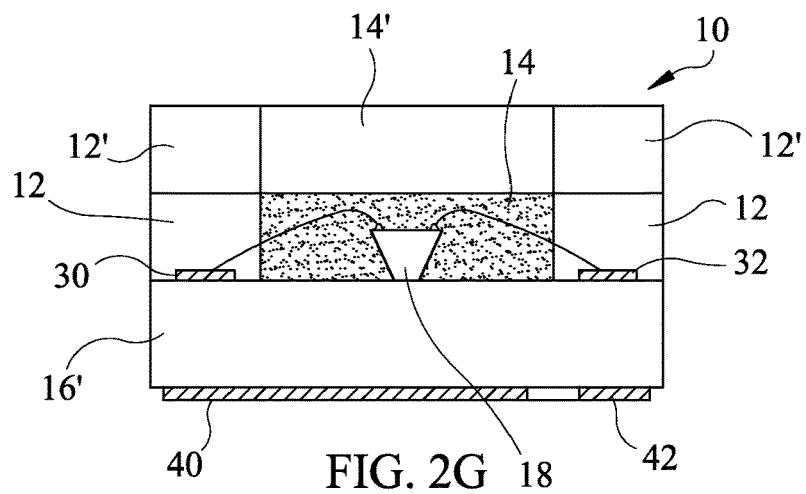
Figure 2H:
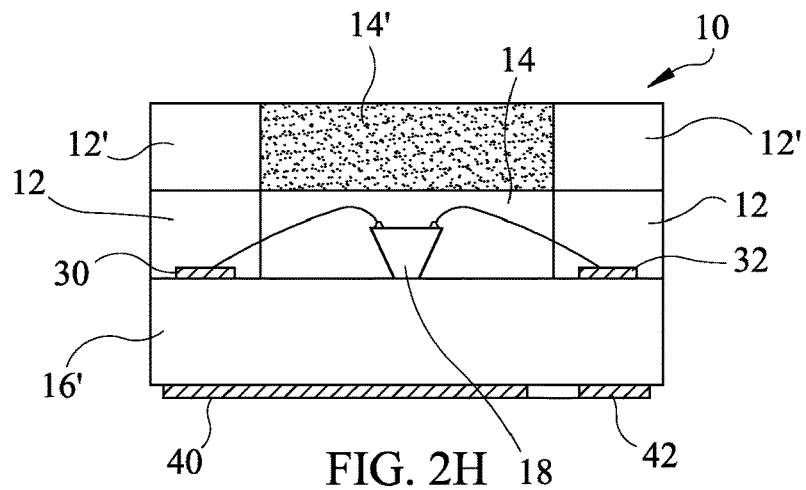

FIGS. 2G to 2K illustrate various exemplary embodiments or permutations of components 10 having multilayered structures 12 and/or multi-layered filler material 14, with and without phosphor, which is illustrated in stippling and/or by the speckled appearance in the Figures. In FIG. 2G, component 10 comprises retention structure 12 having at least two layers (e.g., 12 and 12') and filler material 14 having at least two discrete layers (e.g., 14 and 14'). Each layer can be dispensed. As FIG. 2G illustrates, a bottom layer of filler material 14 comprises phosphor (e.g., indicated via stippling) and a top layer 14' is devoid of phosphor. FIG. 2H illustrates the opposite, where a top layer 14' of filler material comprises phosphor, and a bottom layer of filler material 14 is devoid of phosphor.

Figure 2I:
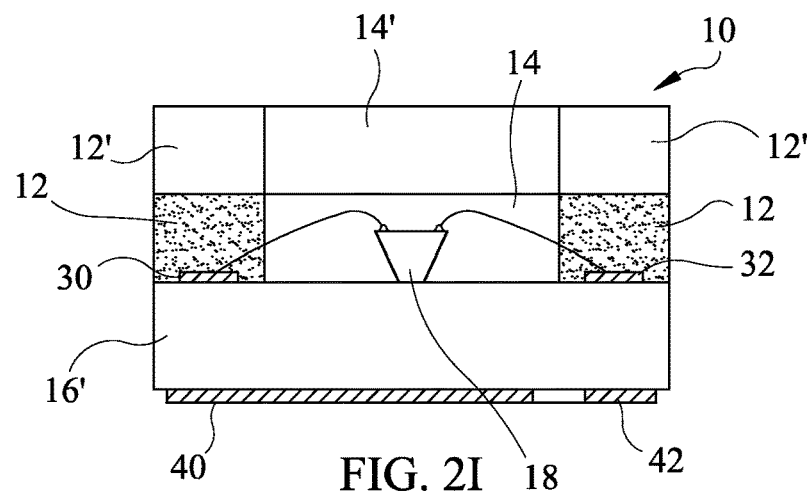

In FIG. 2I, each layer of filler material 14 and 14' is devoid of phosphor. Rather, phosphor can be applied to one or more portions of retention structure 12, such as in a bottom layer of retention structure.

Figure 2J:
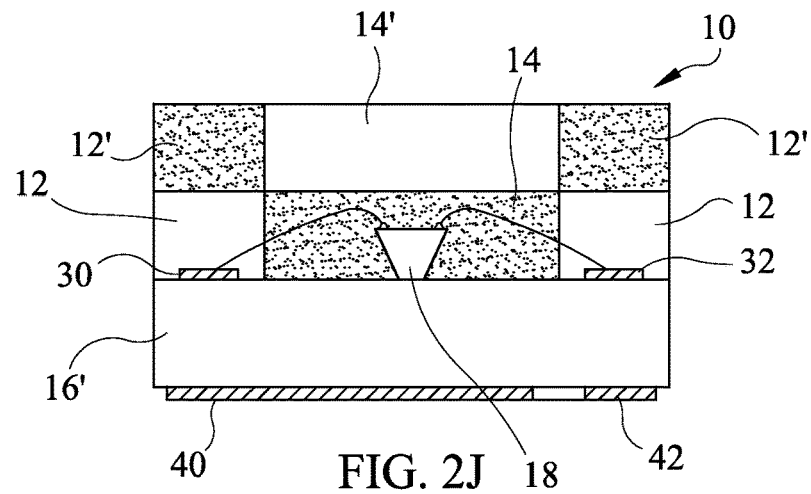

In FIG. 2J, portions of retention structure 12 and filler material 14 both comprise phosphor, while other portions are devoid of phosphor. For example, phosphor is dispersed within an upper layer 12' or portion of retention structure 12. A bottom layer of retention structure 12 is devoid of phosphor. An upper layer 14' or portion of filler material is devoid of phosphor, while a bottom layer of filler material 14 comprises phosphor. Customized retention structures 12 (e.g., walls or dams) can be customized for performance, operability, light emission, optical properties, and/or use in various lighting products and/or applications.

Figure 2K:
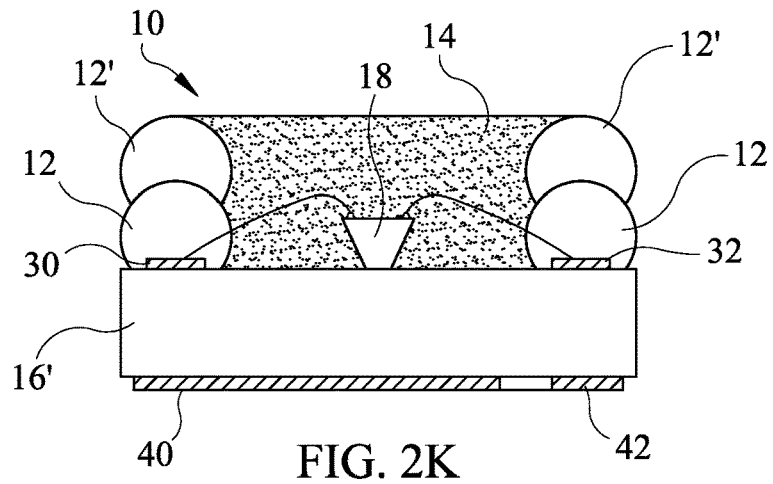

In FIG. 2K, multiple retention structures 12 may be dispensed, however, only a single layer of filling material 14 may be provided between innermost walls thereof. That is, in some embodiments, multiple retention structures 12 are configured to retain only one layer of filling, applied via a single pass/dispense step. Thus, the need to dispense multiple layers of filling material may be obviated.

FIGS. 1A to 2K collectively illustrate a method of providing a panel P, providing traces (e.g., 30, 32, FIG. 2A) over panel P, attaching LED chips 18 (FIG. 2A) to panel P, wire bonding LED chips 18 to each other and/or to traces, providing a retention wall, dam or structure (e.g., 12, FIG. 1A) over panel P and around or about one or more LED chips 18, providing filler material (e.g., 14, FIG. 1A) between one or more opposing walls 12 or 22, and singulating individual components (e.g., 10) from a plurality of components formed on panel P. The retention dam can be configured to retain encapsulant or fill material as described further herein, and the retention dam can be disposed or extend only peripherally around one or more LED chips without extending over or covering the one or more LED chips. In some embodiments, LED chips 18 comprise chip on board (COB) LEDs that are directly attached to panel P via epoxy or some other fixative material.

Figure 3:
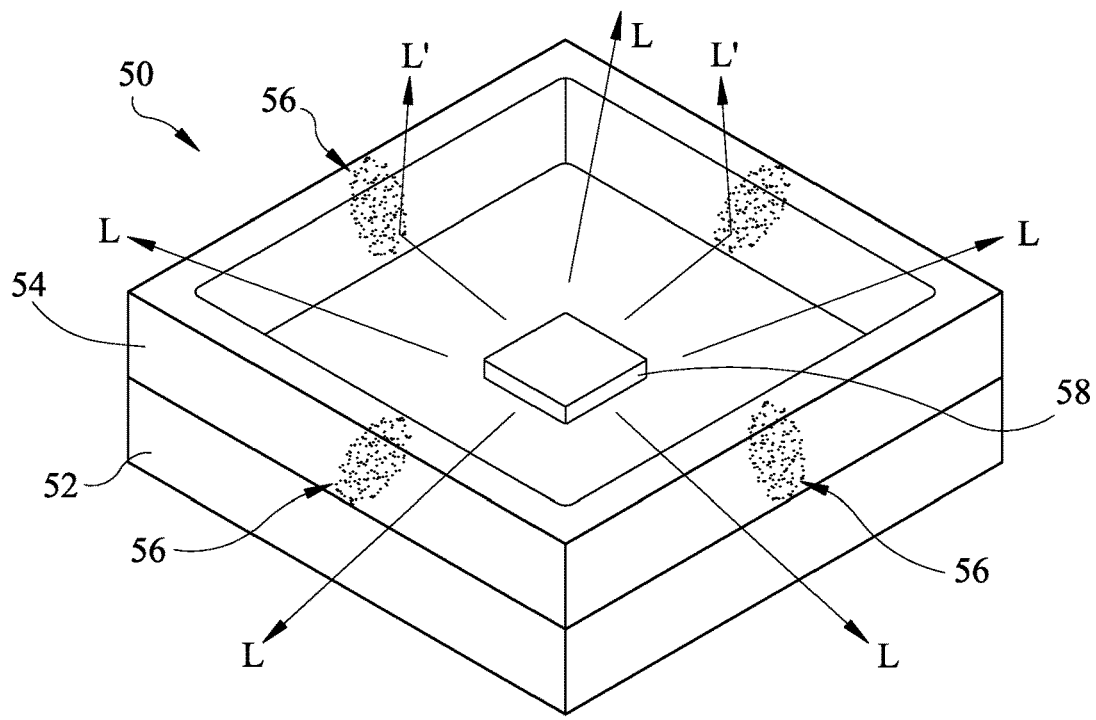
FIG. 3 is a perspective view illustrating a further embodiment of an LED component.

FIG. 3 illustrates a further embodiment of an LED component, generally designated 50. Component 50 comprises a submount 52 and a retention structure, wall, or dam 54 disposed over the submount. A plurality of particles 56 can be non-uniformly disposed in portions of dam 54. Particles 56 may include phosphor or any other light-affecting particles dispersed within, painted on, stenciled on, or otherwise applied to dam 54 in different locations or regions for emitting different colors and/or wavelengths of light from different portions of the component 10. This can be used to achieve adequate or improved color mixing, as the particles can shift the wavelength of light emitted from dam 54 upon impingement with and/or in response to receiving light emitted by at least one LED chip 58. In other embodiments, particles 56 may diffuse, shape, or otherwise direct a pattern or beam of light from L to L'.

Components (e.g., 10, 50, 70 (FIG. 5)) described herein are configured to deliver at least 50 lumens per Watt (LPW) or more, at least 100 LPW or more, at least 110 LPW or more, or more than 150 LPW. Components (e.g., 10, 50, 70 (FIG. 5)) are also configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some embodiments, combined emissions from components herein embody a color rendering index (CRI Ra) value of at least 70, at least 75, at least 80 (e.g., 82 or 85), or at least 90 or more.

Figure 4:
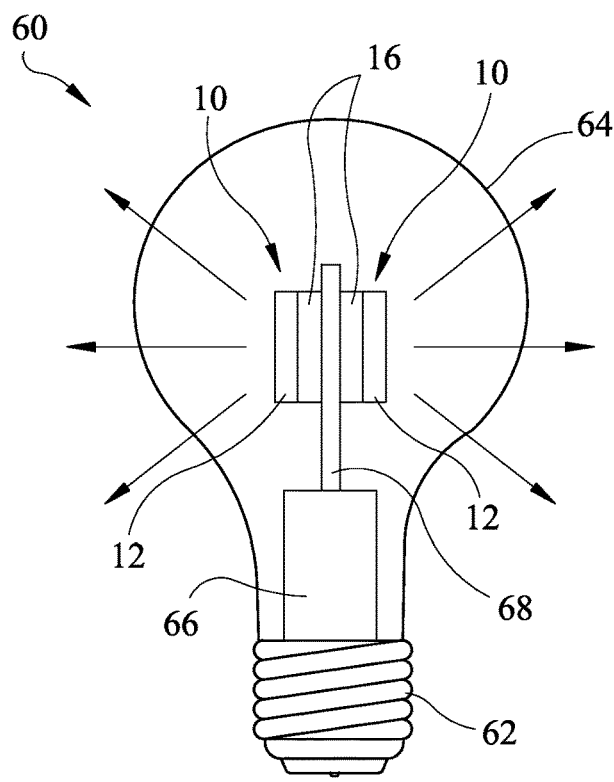
FIG. 4 is a lighting bulb incorporating one or more LED components according to the disclosure herein.

FIG. 4 is a lighting fixture, product, or bulb, generally designated 60. Bulb 60 can incorporate at least one component 10 therein. In some embodiments, multiple components 10 are vertically disposed within a single lighting fixture or bulb 60. Bulb 60 can comprise a cap or base 62 configured to engage an electrical socket for powering and illuminating the bulb. LED components 10 can be housed or encased within an enclosure 64, which can comprise glass. Components 10 can be elevated within enclosure 64 via a pedestal 66 or body, which can comprise a mounting portion 68. Multiple components 10 can be attached and/or mounted to mounting portion 68. Multiple components 10 can be positioned about a plurality of surfaces or sides of mounting portion 68 for emitting light from different angles and/or sides of enclosure 64.

Bulb 60 can deliver at least 50 LPW or more, at least 100 LPW or more, at least 110 LPW or more, or more than 150 LPW. In some embodiments, lighting fixture is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some embodiments, combined emissions from bulb 60 embody a color rendering index (CRI Ra) value of at least 70, at least 75, at least 80 (e.g., 82 or 85), or at least 90 or more. Bulb 60 can also be dimmable, where desired.

Notably, the light intensity distribution of bulb 60 can comprise any light intensity distribution, and in one embodiment comprises the desired light intensity distribution conforms to the ENERGY STAR® Partnership Agreement Requirements for Luminous Intensity Distribution, which is incorporated herein by reference, in the entirety. For an omnidirectional lamp, the Luminous Intensity Distribution is defined as "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135°-180° zone. Distribution shall be vertically symmetrical as measures in three vertical planes at 0°, 45°, and 90°."

In some embodiments, the free end of enclosure 64, opposite to the base 62, is considered 0° and the base 62 of the bulb is considered 180°. As defined in the standard, luminous intensity is measured from 0° to 135° where the measurements are repeated in vertical planes at 0°, 45° and 90°. The structure and operation of bulb 60 of the instant disclosure is compliant with the ENERGY STAR® standard set forth above in some embodiments; however, and in other embodiments, bulb 60 can also be used to create other light intensity distribution patterns.

Figure 5:
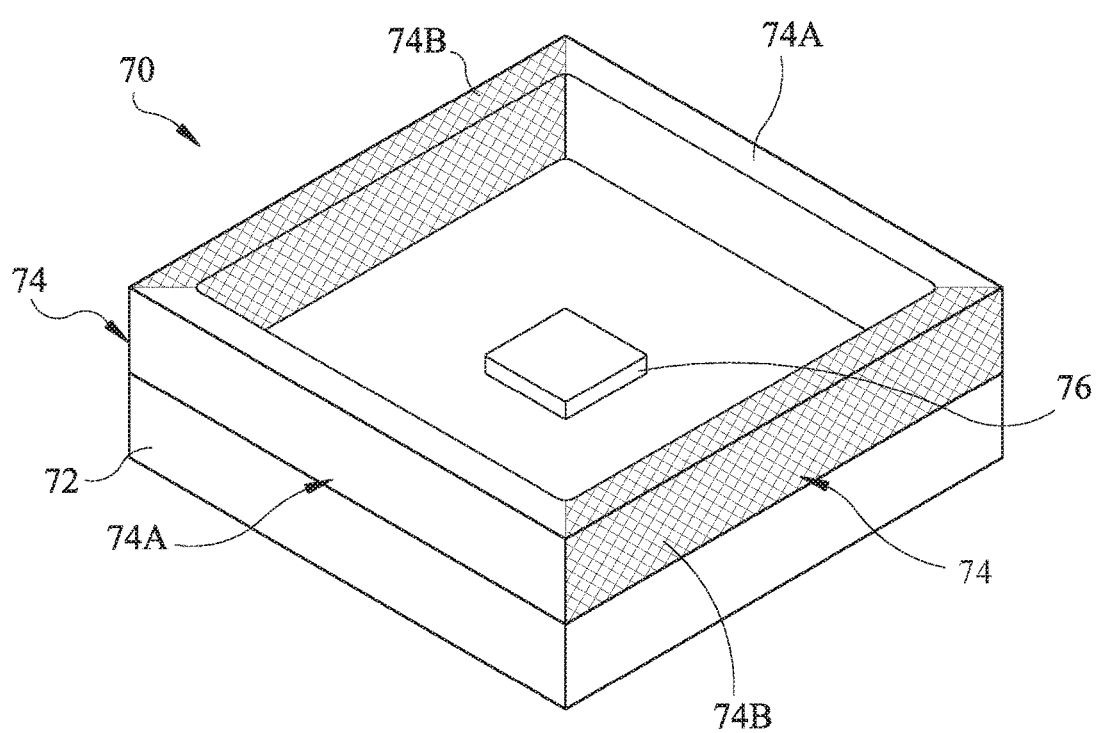
FIG. 5 is a perspective view illustrating a further embodiment of an LED component.

FIG. 5 illustrates a further embodiment of an LED component, generally designated 70. Component 70 comprises at least one LED chip 76, a submount 72, and a retention structure, wall, or dam, generally designated 74 disposed over the submount. Notably, some portions of dam 74 may be opaque and/or reflective, while other portions of dam 74 are non-reflective, clear, and/or transparent. For example, first portions of dam 74A are clear while other portions 74B of dam 74 are opaque. Other portions 74B are hatched to illustrate the opaque visual appearance. This can be used to achieve an increased viewing angle in one direction, or along one plane. Thus, device 70 can comprise different viewing angles along different directions. Clear portions 74A can be adjacent each other, or opposing each other. Similarly, opaque portions 74B can be adjacent to each other, or opposing each other. Any configuration can be provided.

Components described herein can be easily produced as the time consuming process and additional cost associated providing customized packages or components (e.g., customized pressed or molded plastic bodies, cavities, and/or individually molded optical elements) becomes obsolete. A multitude of different customized components, having customized colors, brightness, voltage, power, layout, sizes, and/or viewing angles can be provided without the expense of creating custom fabricated components and/or leadframe components.

Embodiments as disclosed herein may, for example and without limitation, provide one or more of the following beneficial technical effects: reduced cost of providing light emitter components; reduced processing time; increased viewing angle; improved light extraction; more uniform light extraction; improved brightness; improved LPW per power density; improved manufacturability of light emitter components; improved ability to vary component features, such as trace design, number of LED chips, and retention structure layout.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) component, comprising:
   a submount;
   a plurality of electrical traces disposed over a first surface of the submount;
   at least one LED chip disposed over the first surface of the submount, wherein the at least one LED chip is electrically connected to one or more of the plurality of electrical traces; and
   a non-reflective, light permeable dam disposed on the first surface of the submount and around the at least one LED chip thereby providing a component having a viewing angle that is greater than 115°, wherein the dam entirely covers the plurality of electrical traces such that the first surface is devoid of uncovered traces.

2. The component of claim 1, wherein component comprises a viewing angle that is approximately 120° or more.

3. The component of claim 1, wherein component comprises a viewing angle that is approximately 130° or more.

4. The component of claim 1, wherein component comprises a viewing angle that is approximately 140° or more.

5. The component of claim 1, wherein component comprises a viewing angle that is approximately 160° or more.

6. The component of claim 1, wherein the non-reflective, light permeable dam extends only peripherally around the at least one LED chip.

7. The component of claim 1, wherein a filler material is disposed between opposing surfaces of the dam.

8. The component of claim 7, wherein the filler material comprises phosphor.

9. The component of claim 1, wherein the dam is a silicone dam and further comprises one or more light-permeable binders or fillers, and wherein the one or more binders or fillers comprises fumed silica, silica gel, nano-materials, ceramic nanoparticles, ceramic micro-particles, quantum dots, phosphor, ceramic fibers, non-ceramic fibers, or any combination thereof.

10. The component of claim 1, wherein the submount comprises alumina, zirconia, or a mixture, composite or alloy thereof.

11. The component of claim 1, further comprising a plurality of LED chips that are configured to collectively emit white light.

12. A light bulb incorporating the component of claim 1.

13. A light emitting diode (LED) component, comprising:
   a submount;
   an array of LED chips disposed on a first surface of the submount;
   a plurality of traces disposed on the first surface of the submount;
   a non-reflective, light permeable dam disposed on the first surface of the submount about the plurality of LED chips thereby providing a component having a viewing angle that is greater than 115°, wherein the dam entirely covers the plurality of electrical traces such that the first surface is devoid of uncovered traces; and
   a filler material disposed over the array of LED chips and between portions of the dam, wherein the dam and the filler material each comprise multiple, discrete layers of material.

14. The component of claim 13, wherein the dam and the filler material each comprise two discrete layers of material.

15. The component of claim 13, wherein the dam and the filler material each comprise three discrete layers of material.

16. The component of claim 13, wherein the dam comprises at least one layer that is devoid of phosphor.

17. The component of claim 13, wherein the filler material comprises at least one layer that is devoid of phosphor.

18. The component of claim 13, wherein the dam comprises at least one layer that comprises phosphor.

19. The component of claim 13, wherein the filler material comprises at least one layer that comprises phosphor.

20. The component of claim 13, wherein component comprises a viewing angle that is approximately 120° or more.

21. The component of claim 13, wherein component comprises a viewing angle that is approximately 140° or more.

22. The component of claim 13, wherein the dam comprises silicone and one or more light-permeable binders or fillers.

23. The component of claim 22, wherein the one or more binders or fillers comprises fumed silica, silica gel, nanomaterials, ceramic nanoparticles, ceramic micro-particles, quantum dots, phosphor, ceramic fibers, non-ceramic fibers, or any combination thereof.

24. The component of claim 22, wherein the silicone is a dispensable silicone material.

* * * * *